United States Patent
Paul et al.

(10) Patent No.: US 7,474,094 B2
(45) Date of Patent: Jan. 6, 2009

(54) REORIENTATION OF MAGNETIC LAYERS AND STRUCTURES HAVING REORIENTED MAGNETIC LAYERS

(75) Inventors: Johannes Paul, Mainz (DE); Rolf Schaefer, Mainz (DE)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 11/215,551

(22) Filed: Aug. 30, 2005

(65) Prior Publication Data
US 2006/0044700 A1    Mar. 2, 2006

(30) Foreign Application Priority Data
Aug. 31, 2004   (EP) .................................. 04104167

(51) Int. Cl.
*G01R 33/09*  (2006.01)
*B32B 15/00*  (2006.01)

(52) U.S. Cl. .................. 324/252; 324/207.21; 324/249; 428/692.1; 428/693.1

(58) Field of Classification Search ............ 324/207.21, 324/252, 249; 29/603.13, 603.14, 603.27; 360/324–327, 327.22, 313–316; 428/692.1, 428/693.1
See application file for complete search history.

(56) References Cited

U.S. PATENT DOCUMENTS

| 6,413,325 B1 | 7/2002 | Shimazawa et al. ......... 148/108 |
| 6,857,180 B2* | 2/2005 | Horng et al. ............. 29/603.14 |
| 2002/0069511 A1 | 6/2002 | Hasagawa et al. ........ 29/603.14 |

FOREIGN PATENT DOCUMENTS

EP          1182713 A2       2/2002

* cited by examiner

*Primary Examiner*—Bot LeDynh
(74) *Attorney, Agent, or Firm*—Zilka-Kotab, PC

(57) ABSTRACT

Methods of reorienting ferromagnetic layers of a plurality of magnetoresistive elements and structures formed by the methods. The plurality of magnetoresistive elements, preferably GMR multilayer elements, are manufactured and arranged on a planar substrate. The method effectively allows selective orientation and reorientation of distinct ferromagnetic layers of a subset of the magnetoresistive elements on the substrate. The methods make either use of subsequent annealing processes making use of magnetic fields pointing in different directions. Prior to application of a subsequent annealing process, a complementary subset of magnetoresistive elements is effectively shielded by selective deposition of a soft-magnetic shielding layer. Alternatively, a single annealing process can be performed when an externally applied magnetic field is locally modified by soft-magnetic structures, such as fluxguides.

6 Claims, 3 Drawing Sheets

REORIENTATION OF MAGNETIC LAYERS AND STRUCTURES HAVING REORIENTED MAGNETIC LAYERS

FIELD OF THE INVENTION

The present invention relates to the field of magnetoresistive elements featuring an electrical resistance that depends on a magnetic field.

BACKGROUND

Magnetoresistive elements feature an electrical resistance that strongly depends on the magnitude and/or a direction of an externally applied magnetic field. Magnetoresistive elements therefore provide efficient determination of magnetic field strength and magnetic field direction. For example, when the resistance of an element varies with the angle between the element and the direction of an applied magnetic field, by making use of such an element, a rotation angle can be effectively measured in a touch less way.

In particular, by appropriately interconnecting four magnetoresistive elements, e.g. four identical spinvalves where two spinvalves are shielded in the form of a Wheatstone bridge, the direction of an externally applied magnetic field can be determined in an interval of 0° to 180°. Unequivocal determination of a direction of a magnetic field over a range from 0° to 360° can only be detected if spinvalves are used with different pinning directions.

Generally, there exists a large variety of magnetoresistive element types making use of different fundamental effects. For example, the Anisotropic Magnetoresistive (AMR) effect shows a change in electrical resistance in the presence of a magnetic field. AMR sensors are typically made of a soft-magnetic material, such as nickel-iron (Permalloy) thin film deposited on a silicon wafer. The magnetoresistive effect is mainly given by the relative direction between an electrical current and the direction of magnetization.

Another effect denoted as Giant Magneto Resistance (GMR) can be exploited by making use of multilayer systems. Here, the magnetoresistive element features a stack of alternating magnetic and non magnetic layers. Typically, the magnetic layers are ferromagnetic layers. The magnetizations of adjacent ferromagnetic layers are coupled in an anti-parallel orientation. The electrical resistance of such a GMR element strongly depends on the mutual orientation of the magnetization of adjacently positioned magnetic layers.

If a magnetic field is applied, the magnetic force between the magnetic field and the magnetization of the ferromagnetic layers attempts to align the magnetizations of the adjacent layers in a parallel way. Hence the orientation between two adjacent layers is something between parallel (very high field) and anti-parallel (very low field) and depends on the strength of the magnetic field. This results in a magnetic field-dependant resistance. The resistance has its maximum if the orientation between two adjacent layers is anti-parallel and the resistance has its minimum if the orientation between two adjacent layers is parallel. The non magnetic layer for separating two adjacent ferromagnetic layers may be either an electrically conducting or isolating type. In case of positioning an isolating material between the ferromagnetic layers of a GMR system the so called Tunnel Magneto Resistance (TMR) may exhibit.

Principally, GMR systems feature a larger change in electrical resistance compared to AMR systems. However, a GMR multilayer does not inherently allow measurement of a direction of an externally applied magnetic field. This can be achieved by coupling at least one magnetic layer, the pinned layer, to a magnetic layer with fixed spatial orientation, the so called pinning layer. The pinning layer in practice typically comprises an antiferromagnetic material. In this way the direction of magnetization of the pinned layer is spatially fixed while the other ferromagnetic layer features a magnetization that is free to follow an external magnetic field. Therefore, this layer is also denoted as "free layer". These dedicated GMR systems featuring a pinned ferromagnetic layer are also denoted as spinvalves.

Sophisticated magnetic sensors may feature a plurality of GMR elements or spinvalves that have their magnetizations pinned in different directions. In principle, pinning of a magnetic layer can be effectively realized by means of an annealing process. Here, the entire magnetoresistive element is heated to a temperature above the antiferromagnetic layer's Neel temperature and an external magnetic field is applied in order to induce a uniform magnetization of the pinned layer. During subsequent cooling down the external magnetic field remains applied. After cooling down the magnetization of the pinned ferromagnetic layer is maintained by means of a magnetic coupling with the adjacently positioned anti-ferromagnetic bottom layer.

Manufacturing of GMR spinvalves is now subject to mass production. For example, several hundreds or thousands of GMR spinvalves can be produced on a single substrate or wafer. In these mass production processes, individual annealing of various particular GMR elements of a wafer of GMR elements is not possible, because an externally applied magnetic field for pinning of the ferromagnetic layers cannot be separately applied to distinct GMR elements of the wafer.

For many applications a plurality of identical GMR spinvalves with pinned layers of different orientation have to be assembled. Such an assembly can be in principle realized by mounting identical GMR spinvalves in different orientations. Such a process involves manual orientation and assembling of various GMR elements and is therefore time intensive and rather costly.

Another approach for creating an assembly of GMR spinvalves with different orientations may exploit various GMR elements featuring different annealing temperatures. Then, in two successive annealing processes making use of two different annealing temperatures, respective ferromagnetic layers can be separately oriented and fixed. However, this approach involves usage of different ferromagnetic materials that may also differ with respect to other physical properties, like electrical resistance and thermal properties.

Selective reorientation of ferromagnetic layers might also be realized by ion bombardment at the expense of an adverse impact on the electrical resistance of the GMR elements.

The present invention therefore aims to provide a time-and cost efficient way to produce a large amount of equivalent magnetoresistive elements with different magnetization directions.

SUMMARY OF THE INVENTION

A magnetoresistive assembly according to an embodiment includes at least a first and a second magnetoresistive element formed on a common substrate. The at least first magnetoresistive element comprising a first pinned ferromagnetic layer being magnetized in a first direction, the at least second magnetoresistive element comprising a second pinned ferromagnetic layer being magnetized in a second direction different than the first direction. The first and second directions may be substantially anti-parallel, substantially perpendicular, or at some angle in between relative to each other.

The at least first and second magnetoresistive elements may have about equivalent structures. Further, the first pinned ferromagnetic layer of the at least first magnetoresistive element may lie along about a same plane as the second pinned ferromagnetic layer of the at least second magnetoresistive element.

Another embodiment includes a third magnetoresistive element formed on the common substrate, the at least third magnetoresistive element comprising a third pinned ferromagnetic layer being magnetized in a third direction different than the first and second directions.

In a further embodiment, the at least first magnetoresistive element further comprises a first pinning layer for pinning the first pinned ferromagnetic layer. The at least second magnetoresistive element further comprises a second pinning layer for pinning the second pinned ferromagnetic layer.

Illustrative magnetoresistive elements include Giant Magnetoresistance (GMR) elements and Tunneling Magnetoresistance (TMR) elements. The first and second magnetoresistive elements may thus form part of a sensor having at least two contact electrodes for allowing measuring an electrical resistance of the sensor, a magnitude of the electrical resistance being indicative of a magnitude and/or direction of an external magnetic field.

A method of pinning ferromagnetic layers of at least a first and a second magnetoresistive element, where the at least first and second magnetoresistive elements being formed on a common substrate, includes the following. At least a first structure of soft-magnetic material is applied above the substrate, the at least first structure of soft-magnetic material being adapted to manipulate a first magnetic field in the vicinity of the at least first magnetoresistive element in a first way. The first magnetic field is applied in a first direction during a first-direction annealing process.

The at least first structure of soft-magnetic material may be applied as a fluxguide interstitially between the at least first and second magnetoresistive elements.

In another embodiment, the at least first structure of soft-magnetic material may be applied as an at least first layer above the at least first magnetoresistive element. Additionally, a second magnetic field may be applied in a second direction during a second-direction annealing process prior to applying the at least first layer above the at least first magnetoresistive element. The at least first layer of soft-magnetic material may be removed after performing the first-direction annealing process. As an option, a magnitude of the first magnetic field is substantially equal to a magnitude of the second magnetic field. Also, a temperature applied to the at least first and second magnetoresistive elements during the first- and second-direction annealing processes may be substantially equal. Further, the first and second directions of the first and second magnetic fields may be at least one of substantially anti-parallel and substantially perpendicular relative to each other.

In a further embodiment, the method also includes applying an at least second layer of soft-magnetic material above the at least second magnetoresistive element, and applying a third magnetic field in a third direction during a third-direction annealing process.

Other aspects and advantages of the present invention will become apparent from the following detailed description, which, when taken in conjunction with the drawings, illustrate by way of example the principles of the invention.

BRIEF DESCRIPTION OF THE DRAWINGS

In the following, embodiments of the invention will be described in detail by making reference to the drawings in which.

DETAILED DESCRIPTION

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each and any of various possible combinations and permutations.

Figure 1:
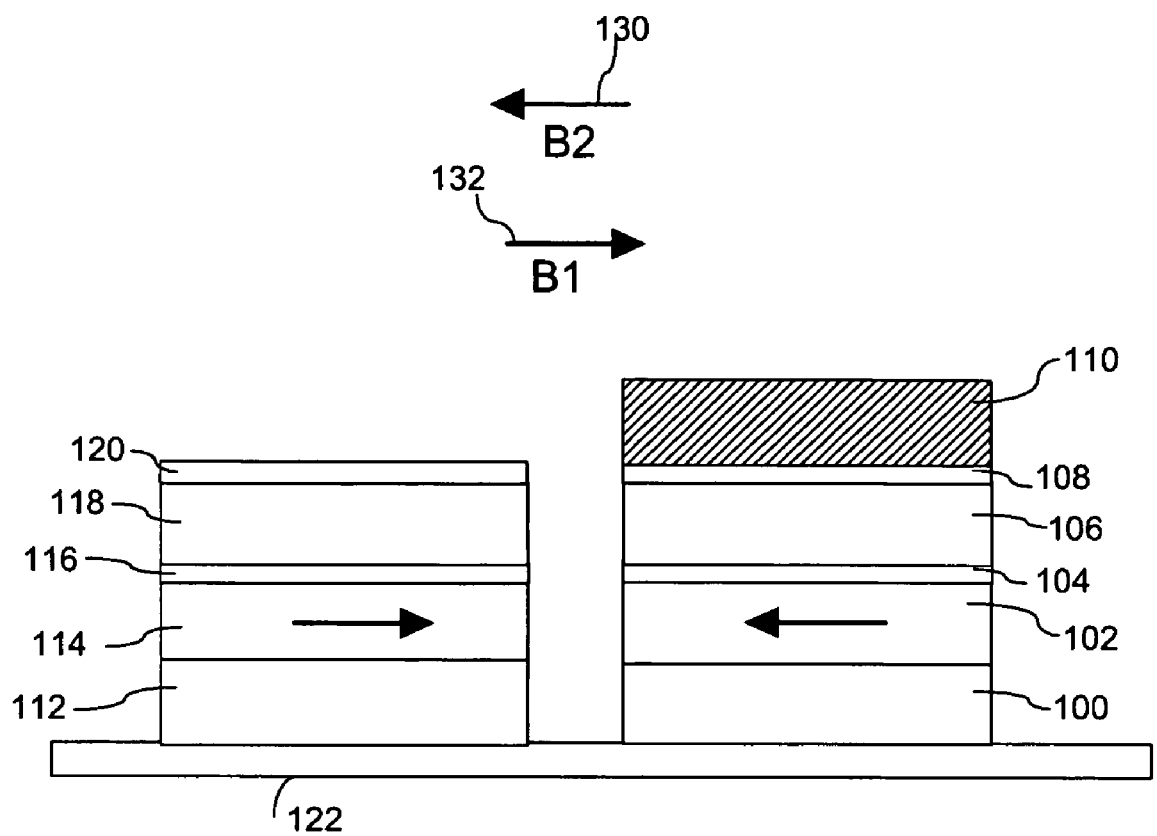
FIG. 1 schematically shows a cross sectional view of the at least first and second magnetoresistive elements, FIGS. 2A-2D successively show one possible process sequence in a top view and cross sectional view illustration, FIG. 3 schematically illustrates usage of fluxguides for generating various local magnetic fields.

FIG. 1 illustrates a cross sectional view of a substrate 122 supporting a first and a second magnetoresistive element. Both first and second magnetoresistive elements are realized as multilayer systems. Here, the first magnetoresistive element has a pinning layer 100, a pinned layer 102, a coupling layer 104, a free layer 106, a protection layer 108 and a shielding layer 110. The second magnetoresistive element has a corresponding layer structure except that is does not have a shielding layer. Note that the equivalent layers of the structures each lie along about the same plane in this embodiment.

Hence, the second magnetoresistive element has a pinning layer 112 that comprises an anti-ferromagnetic material that serves to magnetically fix the adjacent pinned layer 114 comprising a ferromagnetic material. The coupling layer 116 is located on top of the pinned layer 114 and may comprise a conductive material, such as copper, silver or gold. On top of this coupling layer 116, a second ferromagnetic layer 118 is deposited acting as the free layer of the magnetoresistive element. On top of the final free layer 118 the protection layer 120 may be deposited.

The magnetoresistive elements may each act as a magnetic sensor and accordingly would each include at least two contact electrodes (not shown) for allowing measurement of the electrical resistance of the sensor. The magnitude of the electrical resistance is indicative of the magnitude and/or the direction of an externally applied magnetic field, e.g., from a magnetic medium.

The protection layers 108, 120 are adapted to support the shielding layers 110. The protection layer may be deposited on all magnetoresistive elements of the substrate, and serves to protect the layered structure of the magnetoresistive elements from any structural or surface defects that may occur during deposition of the shielding layer 110. In one embodiment of the invention, the protection layers 108, 120 are sputtered on top of the respective element. The protection layers 108, 120 may comprise Aluminum Oxide ($Al_2O_3$) and may feature a thickness in the sub-micrometer range.

The cross sectional illustration of the first and the second magnetoresistive elements reflects a later point in the production process. As can be seen by the arrows, the two pinned layers 102, 114 of the first and second magnetoresistive elements are magnetized in an antiparallel way. The ferromagnetic, pinned layer 114 features a magnetization pointing to the right whereas the pinned layer 102 features a magnetization pointing to the left.

These two oppositely pinned layers 102, 114 have been effectively magnetized by means of two successively applied annealing processes making use of two oppositely directed magnetic fields B1 132 and B2 130.

The shielding layer 110 is able to efficiently shield the applied magnetic field 132. The shielding layer 110 may be constructed of a soft magnetic material. Soft-magnetic materials are preferably those with a magnetic permeability significantly higher than that of free space. Typically, soft-magnetic materials cannot be permanently magnetized to a significant degree. These properties allow soft-magnetic materials to conduct magnetic flux in much the same way as copper wires are used to conduct electric currents. Common examples of soft-magnetic materials are pure iron, nickel-iron steels such as Permalloy, FeAlN, CoFe, and CoZrTa.

The shielding layer 110 creates a local modification of the applied magnetic field with respect to a magnitude and/or direction of the magnetic field. The shielding layer 110 effectively screens or significantly blocks the applied magnetic field. When adjacently arranged next to one of the magnetoresistive elements, the shielding layer 110 serves to induce a local inhomogeneity of an externally applied magnetic field. Hence, the first magnetic field that is applied during the annealing process can be effectively decomposed into two local magnetic fields in the vicinity of the first and second magnetoresistive elements. As a consequence, the first magnetoresistive element experiences a local magnetic field that deviates in magnitude and/or direction from the externally applied magnetic field whereas the second magnetoresistive element experiences a local magnetic field that substantially corresponds to the externally applied magnetic field. In this way, applying a shielding layer 110 provides a local modification of a magnetic field during an annealing process which allows creation of differently pinned magnetoresistive structures in a single annealing procedure.

Accordingly, an annealing leading to a permanent magnetization of the pinned layer 102, in the direction of the applied magnetic field 130 is only applicable in the absence of the shielding layer 110. Consequently, the ferromagnetic layer 102 as well as the ferromagnetic layer 114 are magnetized by a second-direction annealing process by application of the magnetic field B2 130. After application of this second-direction annealing process, both pinned layers 102, 114 remain magnetized in the same direction that corresponds to the direction of the magnetic field B2 130.

In particular, sufficient magnetization of the ferromagnetic layer 102 is only realizable in the absence of the shielding layer 110. Therefore, the shielding layer 110 is selectively deposited on only one of the two magnetoresistive structures after termination of the second-direction annealing process.

Accordingly, the shielding layer 110 that is applied on top of the first multilayer stack effectively serves to shield the underlying structure from any externally applied magnetic field. Therefore, when shielded, the ferromagnetic layers 102, 106 of the first magnetoresistive element become rather insensitive to an externally applied magnetic field B1 132 that is applied after deposition of the shielding layer 110.

By performing a subsequent first-direction annealing process, both magnetoresistive stacks become subject to heating but simultaneous application of a first external magnetic field B1 132 pointing to the right has only a substantial impact on the layers 112, . . . , 120 of the second stack of layers.

Consequently, only the ferromagnetic layer 114 is effectively magnetized by the first external magnetic field B1 132 and changes its direction of magnetization. Cooling down the entire sample and switching off the first magnetic field 132 then leads to the structure depicted in FIG. 1 (described above). The pinned layers 102, 114 of the first and second magnetoresistive elements feature an opposite direction of magnetization.

In this way two substantially identical magnetoresistive elements can be produced that only differ with respect to the direction of magnetization of their pinned layer 102, 114.

The shielding layer 110 can be selectively deposited on arbitrary multilayer stacks of, e.g., a wafer or a substrate 122 featuring a large number of magnetoresistive elements. In this way, the inventive method of selectively shielding distinct magnetoresistive elements and successively applying an additional annealing procedure allows production of a large number of pinned magnetoresistive elements having selectively defined directions of magnetization.

Therefore, the inventive procedure is particularly applicable for mass production of GMR spinvalves in a variety of different magnetization arrangements.

The inventive method of subsequently applying different annealing procedures is universally applicable to different stages of a production process. For example, the inventive pinning procedure can already be applied to stacks of GMR multilayer structures as soon as the anti-ferromagnetic bottom layer 100, 112 and the ferromagnetic pinned layer 102, 114 are deposited on the substrate 122. In this way, a desired pinning can be performed even before the coupling layers 104, 116 and/or free ferromagnetic layers 106, 118 are deposited on the GMR multilayer stacks and before the GMR spinvalves are photolithographically structured.

FIGS. 2A-2D successively illustrate exemplary single steps of subsequent annealing in combination with selective shielding. On the left side an array of four separate multilayer stacks is shown in a top view illustration, whereas on the right hand side a corresponding cross sectional illustration of the multilayer structures is given. The arrows in the left hand illustration represent the magnetic orientation of each pinned layer.

Figure 2A:
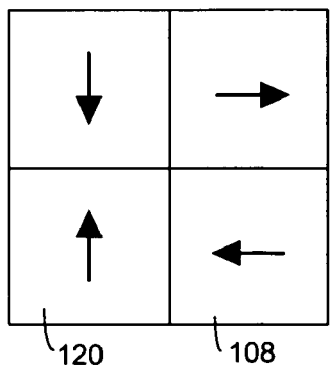
Figure 2A:
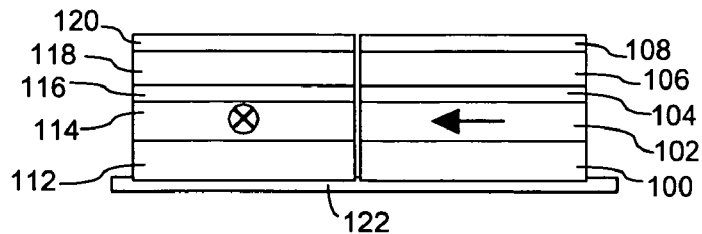

FIG. 2A illustrates an initial state, where the various ferromagnetic pinned layers 102, 114 are arbitrarily magnetized. As can be seen in the right hand illustration, the ferromagnetic pinned layer 102 is initially magnetized in the horizontal direction and the ferromagnetic pinned layer 114 is magnetized a perpendicular direction. Both stacks 100, . . . , 108 and 112, . . . , 120 feature an equivalent structure, except that the magnetizing direction of their pinned layers 102, 114 is non uniform and initially not defined.

Figure 2B:
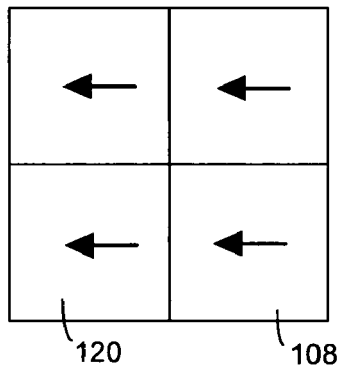
Figure 2B:
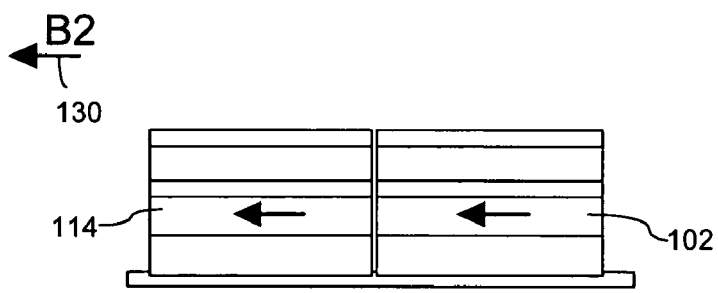

FIG. 2B schematically illustrates application of a second-direction annealing process. Here, the entire wafer featuring four separate GMR multilayer stacks is heated to a temperature, e.g. at least the Neel temperature of the antiferromagnetic layers 100, 112 and an external magnetic field B2 130 is applied in a horizontal direction pointing to the left hand side. Consequently, all four magnetoresistive elements become magnetized according to the externally applied magnetic field B2 130. Compared to FIG. 2A, the ferromagnetic pinned layer 114 switches its state of magnetization. Both ferromagnetic layers 102, 114 now feature a magnetization pointing to the left hand side.

Creating a uniform magnetization direction is of particular relevance in a mass production process where the various ferromagnetic or anti-ferromagnetic layers of the at least first and second magnetoresistive elements may provide different directions of initial magnetization. By applying the second-direction annealing process it can be effectively ensured that the initial orientation of the ferromagnetic or anti-ferromagnetic domains of the magnetoresistive elements is substantially equal for all magnetoresistive elements.

After performing the second direction-direction annealing process, the permanent magnetization of the ferromagnetic layers 102, 114 is effectively fixed by means of magnetic coupling with the respective anti-ferromagnetic layer 100, 112. This means that even after cooling down and switching off the external magnetic field B2, the state of magnetization of the ferromagnetic layers 102, 114 remains constant.

After this second-direction annealing process a shielding layer 110 is selectively applied, e.g., on top of some of the magnetoresistive elements of the wafer. By applying the shielding layer 110, a further reorientation of a pinned ferromagnetic layer 102 can be effectively locally prevented. In principle, the shielding layer 110 can be deposited by any conceivable and applicable deposition technique, such as e.g., electroplating, sputtering, etc.

Figure 2C:
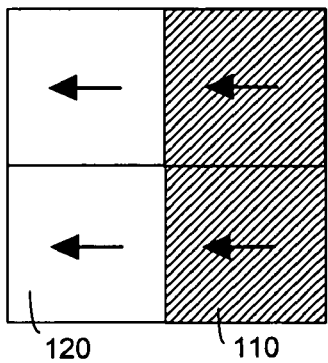
Figure 2C:
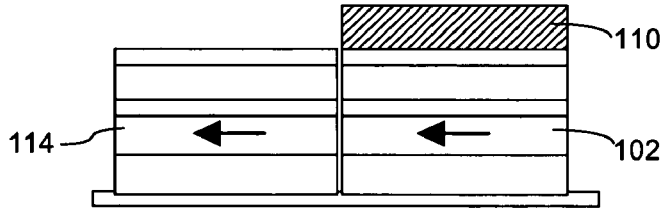

FIG. 2C schematically illustrates deposition of the shielding layer 110 on top of the two right hand side magnetoresistive elements. The shielding layer comprises a soft-magnetic material, such as Permalloy, FeAlN, CoFe, CoZrTa.

In an illustrative process for applying a shielding layer 110 to the magnetoresistive elements on the right hand side, a layer of photoresist is applied and patterned to define areas where the shielding layer is to be deposited. After curing the photoresist, the defined areas are removed by standard techniques, e.g., application of a solvent. In FIG. 2B, the exposed area would be above the magnetoresistive elements on the right hand side. Then a soft-magnetic material is formed in the exposed areas, e.g., by electroplating, sputtering, etc. The remaining photoresist (above the magnetoresistive elements on the left hand side) may be removed by conventional photoresist liftoff techniques. The remaining photoresist may also remain until removal of the shielding layer 110, if removed. In further embodiments, the photoresist may never be removed.

Figure 2D:
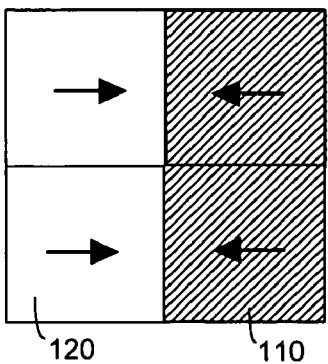
Figure 2D:
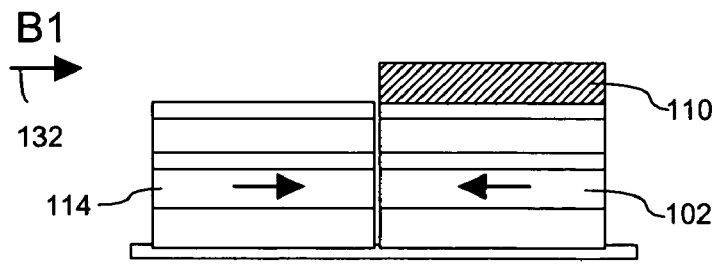

After depositing the shielding layer 110, an externally applied magnetic field is effectively shielded in the two right hand side multilayer stacks 100, . . . , 108. Therefore, subsequent application of an oppositely directed magnetic field B1 132 as shown in FIG. 2D has no substantial effect on the magnetization of the ferromagnetic pinned layer 102.

In one embodiment of the present invention, the first external applied magnetic field B1 132 is applied during a first-direction annealing process that effectively allows reorientation of the magnetization of the ferromagnetic pinned layer 114. In this way four magnetoresistive elements can be produced that feature an equivalent internal structure but oppositely oriented and hence oppositely magnetized pinned layers 102, 114.

The inventive method is by no means restricted to application of only two subsequent annealing processes and hence two different directions of magnetization. For example, by subsequently depositing a shielding layer on top of, e.g., the lower left magnetoresistive element, and by subsequently performing a third-direction annealing process making use of, e.g., a vertically oriented magnetic field, the upper left magnetoresistive element can be effectively pinned in a vertical direction.

Application of this third-direction annealing process is only preferred if there exists at least three magnetoresistive elements on the substrate. In this way, any one of the magnetoresistive elements can be selectively pinned by the first, second or third-direction annealing processes. In principle, the inventive methods of selectively pinning of ferromagnetic layers is not restricted to two or three subsequent annealing processes. Generally, the maximum number of depositions of soft-magnetic material layers and subsequent execution of an associate annealing process may only be limited by the thermal properties of the single magnetoresistive elements. In realistic scenarios it has been shown that at least six annealing processes can be successively applied without having a significant impact on the composition or thermal properties of the magnetoresistive multilayer structures.

Additionally, the magnitude or strength of the first and the second magnetic fields may be substantially equal or different. Moreover, the temperature to which the at least first and second magnetoresistive elements are heated during the first and the second-direction annealing processes may be substantially equal or different. By using substantially equal magnetic field strengths and annealing temperatures in the various annealing processes, it can nearly be ensured that the at least first and second magnetoresistive elements only differ with respect to the direction of their differently pinned layers.

Moreover, deposition of the second shielding layer can also be performed in the presence of the first shielding layer. Regardless, deposition of the second shielding layer is preferably only applied to those magnetoresistive elements that were not already covered by the first shielding layer. Deposition of the second shielding layer prior to removal of the first shielding layer has the advantage that both first and second shielding layers can be removed in a single step. Further, any overlap of the second shielding layer on the first shielding layer has virtually no adverse effect on subsequent processing.

Referring again to the example illustrated by FIGS. 2A-2D, the first-direction annealing process is applied after performing the second-direction annealing process that serves to uniformly orient the ferromagnetic layers 102, 104. Alternatively, the first-direction annealing process can be applied without a prior application of the second-direction annealing process. In particular, when the ferromagnetic layers 102, 114 already feature a uniform magnetization, this second-direction annealing process can be effectively omitted. In this way, the procedure of selective annealing of selected magnetoresistive elements can be performed by means of applying a shielding layer 110 and by subsequently performing the first-direction annealing process on the basis of the magnetic field B1 132.

After completion of the first-direction annealing process, the shielding layer may be removed by, e.g., chemical etching. Thereafter, the various magnetoresistive elements may become subject to electrical contacting or similar process steps, e.g., that are necessary for the production of a desired GMR spinvalve assembly.

Also, the inventive method of pinning of ferromagnetic layers can be applied during a production process of a wafer supporting a plurality of GMR elements. The wafer may either comprise an intermediate manufacturing product or fully developed GMR elements.

For example, an intermediate manufacturing product may refer to a wafer that supports only two structures, namely an anti-ferromagnetic layer and a ferromagnetic layer that shall become subject to pinning. Therefore, the inventive method effectively allows simultaneously reorientation of a subset of GMR elements of a wafer of GMR elements.

Another example of an intermediate manufacturing product may refer to a wafer where the GMR material is a single full film layer covering the full wafer deposited by sputtering but not yet structured to single distinct and shaped elements.

Hence, the inventive method can be universally applied during a manufacturing process or after completion of manufacturing to a wafer of GMR stacks. Application of the inventive pinning method in some embodiments may include performing the method on a structure having an anti-ferromagnetic pinning layer on top or at the bottom of a ferromagnetic layer that shall become subject to pinning.

According to a further embodiment of the invention, the first and the second directions of the first and second magnetic fields are substantially antiparallel or perpendicular. In this way, the pinned layers of the at least first and second magnetoresistive elements are oriented in an antiparallel or perpendicular way, respectively. However, the methods described herein also allow relative magnetization orientations other than just antiparallel and perpendicular. By varying the directions of the applied magnetic fields, virtually any relative angle of magnetizations can be achieved.

In particular for a Wheatstone bridge arrangement of four GMR elements, a pairwise antiparallel orientation of the pinned layers of the four magnetoresistive elements is advantageous. By the method disclosed herein, these four magnetoresistive elements can be directly produced on a common substrate without manually arranging and reorienting any of the magnetoresistive elements. Hence, a desired pinning orientation can be realized in a cost efficient, space saving and reliable way.

Figure 3:
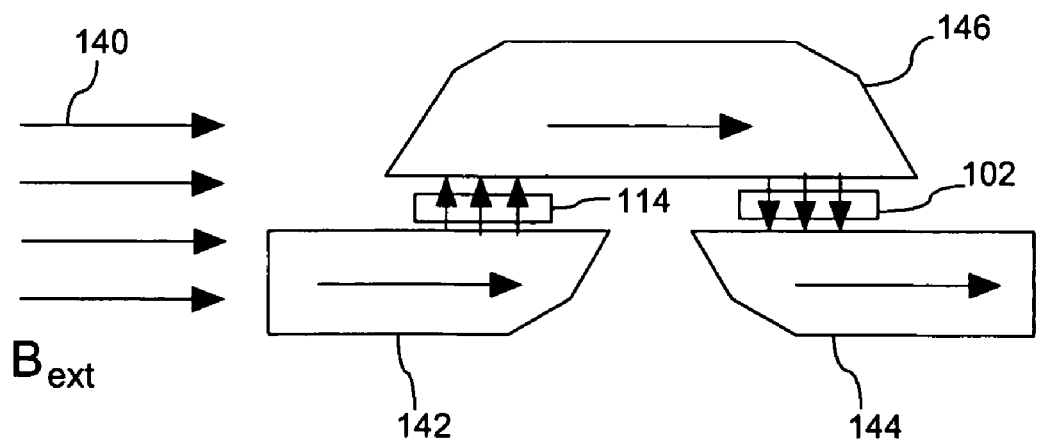

According to a further embodiment of the invention, shielding structures of soft-magnetic material can be applied as fluxguides. FIG. 3 schematically shows a top view of an embodiment making use of fluxguides of soft-magnetic material 142, 144 and 146. In particular, in this embodiment at least first and second pinned layers 102, 114 of respective first and second magnetoresistive elements are positioned between closely spaced fluxguides 142, 144, 146. The fluxguides 142, 144, 146 may comprise the same soft-magnetic material as the shielding layers described above. In particular, the magnetic fields between closely spaced fluxguides 142, 146 and 146, 144 are substantially perpendicular to the direction of the gap between the respective fluxguides.

By applying an external magnetic field 140 pointing to the right hand side, the magnetic field in the gap between fluxguide 142 and fluxguide 146 points upwardly and the magnetic field between fluxguide 146 and fluxguide 144 substantially points downwards. Consequently, the two interstitial magnetic fields point in opposite directions. Making use of this fluxguide geometry, the pinned layer 102, 114 of the respective first and second magnetoresistive elements can be positioned in the respective gaps between the fluxguides 142, 146 and 146, 144. Consequently, by applying a single magnetic field 140 two oppositely oriented magnetic fields can be effectively generated at two different locations on the substrate 122 in a single annealing step.

Positioning the two layers 102, 114 interstitially between the fluxguides 142, 146 and between fluxguides 144 and 146, effectively allows pinning of the two layers 102, 114 even in an opposite direction by a single annealing process.

In this way application of local differently-oriented magnetic fields can be realized within a single annealing process. One practicing the invention should ensure that the fluxguides of soft-magnetic material 142, 144, 146 are appropriately positioned on the substrate 122. Moreover, an appropriate geometry of the at least three fluxguides should be selected for generation of the respective local oppositely directed magnetic fields. In one example making use of a rectangular shaped fluxguide, the different magnetization directions may differ by +/−45 degrees relative to the direction of the annealing field.

Alternatively, various other configurations of fluxguide geometries are conceivable. For example, the fluxguides may feature a quadratic or rectangular shape and might be arranged in a regular order on a grid. In such a configuration, the arrangement of fluxguides provides a separation of the spatial components of the applied magnetic field. When the gaps between the fluxguides are oriented, e.g., horizontally or vertically, the applied magnetic field can be effectively decomposed into horizontal and vertical components. Arranging of magnetoresistive stacks interstitially between these gaps effectively provides a substantially perpendicular orientation of the corresponding ferromagnetic or anti-ferromagnetic layers 102, 114.

Performing a single annealing process is advantageous if the layer to be pinned by the annealing comprises a material that only allows for a single annealing process, e.g., the pinned layer might not allow for a magnetic reorientation in a subsequent annealing process. An example for such a material is an alloy of Platinum-Manganese.

Additionally, by making use of more sophisticated arrangements of various fluxguides with a particular geometry, an external magnetic field might be partially decomposed at particular locations on the substrate into two mutually antiparallel magnetic fields. In this case, two oppositely oriented magnetic fields can in principle be locally generated on the substrate simultaneously. This even allows for an antiparallel pinning of ferromagnetic layers of magnetoresistive elements, such as, e.g., spinvalves in a single annealing step.

In principle, it is also possible to realize a combined application of soft-magnetic material interstitially and on top of magnetoresistive elements. In this way, some of the magnetoresistive elements might be shielded from the applied magnetic field while others might be pinned along various directions during a single annealing process.

Figure 4:
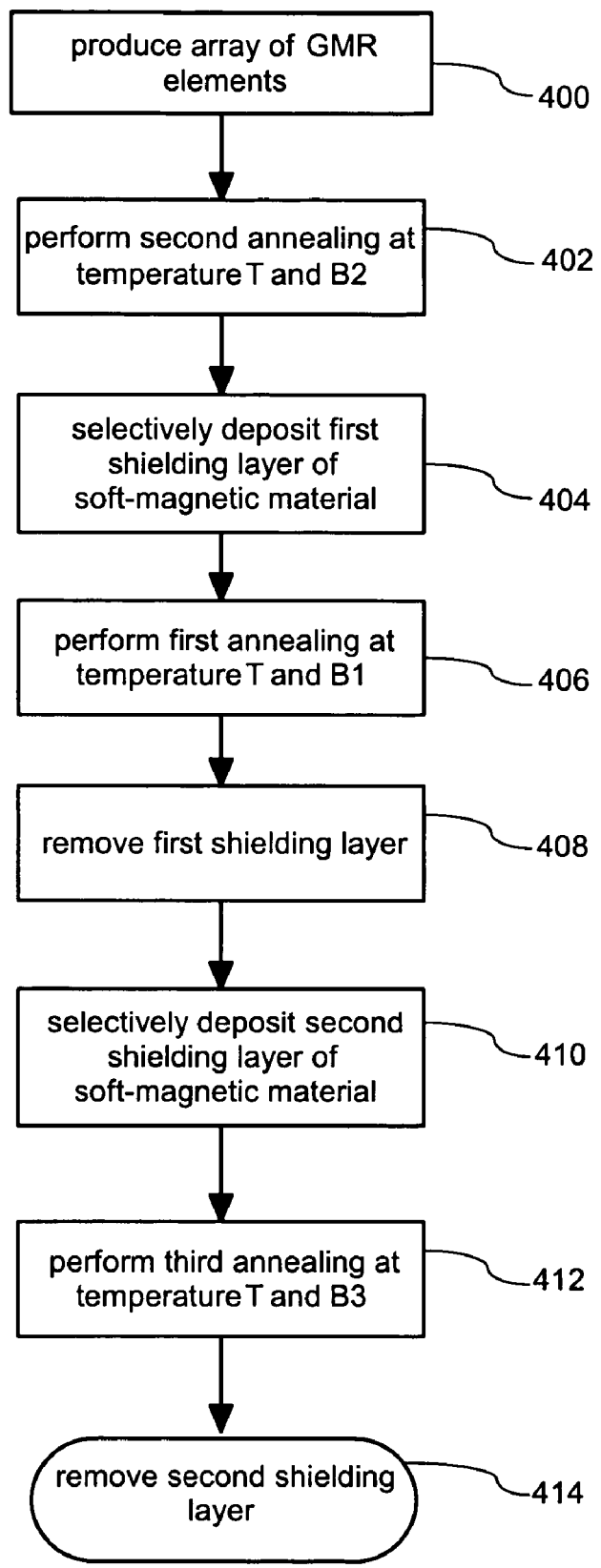
FIG. 4 is illustrative of a flowchart of performing an inventive selective pinning method according to one embodiment.

FIG. 4 illustrates a process for performing a selective pinning method according to one embodiment. In a first step 400 an array of magnetoresistive elements, preferably GMR spinvalves, is produced. Thereafter, in a successive step 402 a second-direction annealing procedure is performed by applying a second magnetic field B2 when the sample is heated above a phase transition temperature, typically the Neel temperature of the respective anti-ferromagnetic material.

After this annealing process a shielding layer of soft-magnetic material is selectively deposited on top of some of the magnetoresistive elements of the array of magnetoresistive elements in step 404. By selectively depositing the soft-magnetic shielding layer, the selected magnetoresistive elements effectively become insensitive to externally applied magnetic fields. Hence, by performing a first-direction annealing process, in the subsequent step 406 only those magnetoresistive elements that were not subject to shielding are effectively reoriented by a first externally applied magnetic field B1. Consequently, the ferromagnetic pinned layers of the unshielded magnetoresistive elements become subject to a reorientation according to the direction of the external magnetic field B1.

After successive application of second and first-direction annealing procedures, the shielding layer can be removed in step 408. Thereafter, the array of magnetoresistive elements may be subject to further manufacturing steps, such as addition of layers, electrical contacting, etc.

Additionally, the entire array of magnetoresistive elements may become subject to a deposition of a second shielding layer of soft-magnetic material. In this way a second set of magnetoresistive elements might be selected for an additional annealing process. Therefore, after deposition of the second shielding layer in step 410, a third-direction annealing process can be performed in the subsequent step 412. Preferably, all three annealing processes that are applied in steps 402, 406 and 412 make use of the same annealing temperature but differently oriented magnetic fields of about equal strength that is sufficient to reorient the unshielded pinned layer(s) but not have a significant effect on any shielded pinned layer(s).

The various annealing processes may be similar, only differing with respect to the direction of the applied magnetic field. In this way, the various magnetoresistive elements may feature equivalent general electrical and physical properties. They may only with respect to the magnetizing direction of their pinned layers. In the last step 414 the second shielding layer is finally removed and the entire array of magnetoresistive elements may become subject to further manufacturing processes.

The inventive methods described herein are applicable to mass production of magnetoresistive elements and in particular GMR spinvalves and TMR elements. Here, the magnetoresistive elements, i.e., the single layers that constitute the various magnetoresistive elements, are typically deposited as a homogeneous, spatially unstructured layer onto the substrate or onto previously deposited layers. After deposition of the various layers, the entire stack is typically structured in order to form various separate magnetoresistive elements. Irrespectively of the structure of the multilayer stack, the method is universally applicable in order to provide a sufficient pinning and fixing of ferromagnetic layers adjacent to antiferromagnetic layers.

Further, the process of annealing as well as application of the shielding layers can be universally applied at any stage of the production process, i.e., prior to or after structuring of the magnetoresistive elements. In this context a magnetoresistive element may equally refer to a structured stack of layers as well as to an area of an unstructured stack of layers. Such an area then typically specifies the circumference of a magnetoresistive element that is formed in a successive structuring procedure.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method of pinning ferromagnetic layers of at least a first and a second magnetoresistive element, the at least first and second magnetoresistive elements being formed on a common substrate, the method of pinning comprising:
   applying at least a first structure of soft-magnetic material above the substrate, the at least first structure of soft-magnetic material being adapted to manipulate a first magnetic field in the vicinity of the at least first magnetoresistive element in a first way, wherein the at least first structure of soft-magnetic material is applied as an at least first layer above the at least first magnetoresistive element;
   applying the first magnetic field in a first direction during a first-direction annealing process; and
   applying a second magnetic field in a second direction during a second-direction annealing process prior to applying the at least first layer above the at least first magnetoresistive element.

2. The method according to claim 1, further comprising removing the at least first layer of soft-magnetic material after performing the first-direction annealing process.

3. The method according to claim 1, wherein a magnitude of the first magnetic field is substantially equal to a magnitude of the second magnetic field.

4. The method according to claim 1, wherein a temperature applied to the at least first and second magnetoresistive elements during the first- and second-direction annealing processes is substantially equal.

5. The method according to claim 1, wherein the first and second directions of the first and second magnetic fields are at least one of substantially anti-parallel and substantially perpendicular relative to each other.

6. The method according to claim 1, further comprising:
   applying an at least second layer of soft-magnetic material above the at least second magnetoresistive element; and
   applying a third magnetic field in a third direction during a third-direction annealing process.

* * * * *